United States Patent
Chu et al.

(10) Patent No.: US 8,610,206 B2
(45) Date of Patent: Dec. 17, 2013

(54) SPLIT-GATE LATERAL DIFFUSED METAL OXIDE SEMICONDUCTOR DEVICE

(75) Inventors: Chien-Wen Chu, Taoyuan County (TW); Wing-Chor Chan, Hsinchu (TW); Shyi-Yuan Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 460 days.

(21) Appl. No.: 13/030,815

(22) Filed: Feb. 18, 2011

(65) Prior Publication Data

US 2012/0211832 A1    Aug. 23, 2012

(51) Int. Cl.
*H01L 29/78*    (2006.01)

(52) U.S. Cl.
USPC ............... 257/335; 257/343; 257/E29.256; 257/E29.258

(58) Field of Classification Search
USPC ......... 257/335, 336, 337, 338, 339, 343, 340, 257/409, 492, 493, E29.256, E29.258, 257/E29.134, E29.136, E21.417, E21.427
See application file for complete search history.

(56) References Cited

U.S. PATENT DOCUMENTS

| 7,521,759 | B2 * | 4/2009 | Sasaki | 257/340 |
| 2007/0007591 | A1 * | 1/2007 | Theeuwen et al. | 257/340 |
| 2011/0260247 | A1 * | 10/2011 | Yang et al. | 257/343 |

* cited by examiner

*Primary Examiner* — Calvin Lee
*Assistant Examiner* — Scott Stowe
(74) *Attorney, Agent, or Firm* — Baker & McKenzie LLP

(57) ABSTRACT

A semiconductor device comprises a source region, a drain region, and a drift region between the source and drain regions. A split gate is disposed over a portion of the drift region, and between the source and drain regions. The split gate includes first and second gate electrodes separated by a gate oxide layer. A self-aligned RESURF region is disposed within the drift region between the gate and the drain region. PI gate structures including an upper polysilicon layer are disposed near the drain region, such that the upper polysilicon layer can serve as a hard mask for the formation of the double RESURF structure, thereby allowing for self-alignment of the double RESURF structure.

19 Claims, 5 Drawing Sheets

SPLIT-GATE LATERAL DIFFUSED METAL OXIDE SEMICONDUCTOR DEVICE

BACKGROUND

1. Technical Field

The present application relates generally to semiconductor devices, include semiconductor devices used in high voltage applications.

2. Related Art

Laterally diffused metal oxide semiconductor (LDMOS) devices are typically used in high voltage applications. FIG. 1 shows an example of a conventional LDMOS. The LDMOS in FIG. 1 includes a high-voltage N-well (HVNW) region 102 on a P-type substrate 100. A P-type body 110 and a N-type well 120 are formed in the HVNW region 102. A gate is formed by a gate oxide layer 175 and a polysilicon gate layer 170. Also, a portion of the gate layer 170, referred to as the field plate, extends over a central field oxide (FOX) region 162. The relatively thick central FOX region 162 serves to increase the breakdown voltage of the device by reducing electric field crowding at the gate edge. Further, two additional FOX regions 160 and 164 are formed, one at each side of the LDMOS device, which serve to isolate the device from other devices. An N+ doped region 180 is formed within the N-type well 120 in order to form a drain region, and another N+ doped region 185 is formed in the P-type body 110 in order to form a source region. In addition, with regard to the N+ doped region 185 formed in the P-type body 110, an adjacent P+ pickup region 190 is provided to reduce resistivity. The LDMOS device shown in FIG. 1 can be manufactured as disclosed by U.S. Pat. No. 7,192,834, which is hereby incorporated by reference.

Also there is a known device that has a so-called double reduced surface field (double RESURF) structure wherein a drift layer is formed in the surface of a semiconductor active layer, and a RESURF layer is formed in the surface of the drift layer. For example, U.S. Pat. No. 6,614,089 discloses an N-MOSFET that is fabricated to have an active layer and a RESURF layer, both of which are the p-type, and a drift layer of the n-type. In the MOSFET having such a structure, the n-drift layer is sandwiched by the p-RESURF layer and the p-active layer on the upper and lower sides, respectively, and thus can be easily depleted. Accordingly, the drift layer can be doped with an n-carrier impurity at a higher dose, thereby providing an advantage in that the on-resistance ($R_{on}$) decreases.

When designing LDMOS devices, it is desirable for the device to have a very high breakdown voltage ($V_{bd}$), while also exhibiting a low on-resistance $R_{on}$ during operation. LDMOS devices having a low on-resistance and a high breakdown voltage will typically exhibit a relatively lower power loss when used for high-voltage applications. One problem when designing such LDMOS devices is that techniques and structures that tend to maximize the breakdown voltage $V_{bd}$ tend to adversely affect the on-resistance $R_{on}$, and vice versa.

Thus, it is desirable to find new approaches for improving trade-off between the breakdown voltage and on-resistance of LDMOS devices, particularly so as to allow for shrinking the feature size of LDMOS devices without degrading the device characteristics.

SUMMARY

According to one aspect of the present disclosure, a semiconductor device can comprise a source region on a substrate, a drain region on the substrate, a drift region between the source and drain regions, a split gate disposed over a portion of the drift region, and between the source and drain regions, the split gate including first and second gate electrodes separated by a gate oxide layer, and a gate region disposed between the drift region and the drain region, the gate region including an upper polysilicon layer.

The split gate can comprise a first gate oxide layer over the drift region, a first gate electrode layer formed over a first portion of the first gate oxide layer, a second gate oxide layer formed over a second portion of the first gate oxide layer and over a portion of the first gate electrode layer, and a second gate electrode layer formed over the second gate oxide layer. The split gate can further comprise a third gate electrode layer formed over a third portion of the first gate oxide layer, where the second gate oxide layer is further formed over a fourth portion of the first gate oxide layer between the first and third gate electrode layers.

The semiconductor device can further comprise a pickup region adjacent to the source region, where the pickup and source regions are of opposite conductivity types.

The drift region can include a RESURF region. The RESURF region can comprise a first RESURF layer of a first conductivity type. The RESURF region can be a double RESURF region and can include a second RESURF layer of a second conductivity type. For example, the first conductivity type can be n-type, and the second conductivity type can be p-type. The first RESURF layer can be disposed below the second RESURF layer. The first RESURF layer can be formed with implant energy in a range of tens to hundreds KeV, and dosage in a range of several to tens E11/cm2, and the second RESURF layer can be formed with implant energy in a range of tens KeV, and dosage in a range of several to tens E11/cm2. The first RESURF layer can be formed above a high-voltage N-well (HVNW) region.

The substrate can comprise an epitaxial layer.

The gate region can comprise multiple gates disposed between the drift region and the drain region.

According to another aspect of the present disclosure, a semiconductor device can comprise a semiconductor layer of a first conductivity type, a drain region of the first conductivity type formed over the semiconductor layer, a source region of the first conductivity type formed over the semiconductor layer and spaced apart from the drain region such that a drift region is formed between the drain region and the source region, a first gate oxide layer over the drift region, a first gate electrode layer formed over a first portion of the first gate oxide layer, a second gate oxide layer formed over a second portion of the first gate oxide layer and over a portion of the first gate electrode layer, a second gate electrode layer formed over the second gate oxide layer, a double RESURF region formed in at least a portion of the drift region, the double RESURF region including a first RESURF layer of the first conductivity type and a second RESURF layer of the second conductivity type formed over the first RESURF layer, and a first gate region disposed between the drift region and the drain region, the first gate region including an upper polysilicon layer.

The first conductivity type can be, for example, n-type, and the second conductivity type can be, for example, p-type.

The first RESURF layer can be formed with implant energy in a range of tens to hundreds KeV, and dosage in a range of several to tens E11/cm2, and the second RESURF layer can be formed with implant energy in a range of tens KeV, and dosage in a range of several to tens E11/cm2.

The semiconductor device can further comprise a first region of the first conductivity type formed as a first well in the semiconductor layer, and a second region of the second conductivity type formed as a second well in the semiconductor layer, where the drain region is formed in the first region, and the source region is formed in the second region. The semiconductor device can also further comprise a pickup region of the second conductivity type formed in the second region.

The semiconductor device can further comprise a third gate electrode layer formed over a third portion of the first gate oxide layer, where the second gate oxide layer is further formed over a fourth portion of the first gate oxide layer between the first and third gate electrode layers.

The semiconductor layer can comprise an epitaxial layer.

The gate region can comprise multiple gates disposed between the drift region and the drain region.

BRIEF DESCRIPTION OF THE DRAWINGS

Features, aspects, and embodiments of the inventions are described in conjunction with the attached drawings, in which.

DETAILED DESCRIPTION

Disclosed herein is a system and method for manufacturing power devices, for example an LDMOS device or an extended drain MOSFET (EDMOS) device, having a split gate and a self-aligned double RESURF feature in the drift region. The split gate can be made, for example, using a second polysilicon layer, a high temperature oxide (HTO) film, general process layers in a polysilicon-insulator (PI) gate, and high-resistance polysilicon. The split gate introduces a gate extension that can reduce the peak electric field and therefore allow for a relatively shorter drift region. The double RESURF feature in the drift region can further allow for a reduction in the size of the drift region, while still maintaining desirable low on-resistance $R_{on}$ value. Also, an additional top polysilicon layer allows for the double RESURF feature to be self-aligned by using the top polysilicon layer as a hard mask to define implantation area(s) for regions of the double RESURF feature. Therefore, the present disclosure can provide for a power device, such as an LDMOS device, having an improved trade-off between on-resistance $R_{on}$ and breakdown voltage $V_{bd}$ over prior power devices and improved manufacturing processes.

Figure 1:
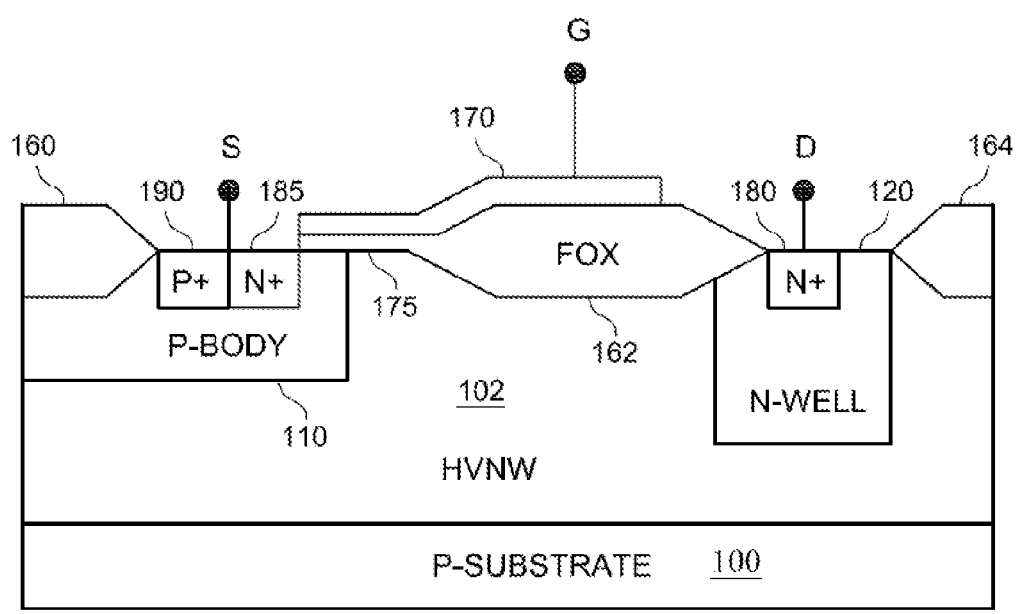
FIG. 1 shows a cross-sectional view of a conventional LDMOS.
Figure 2:
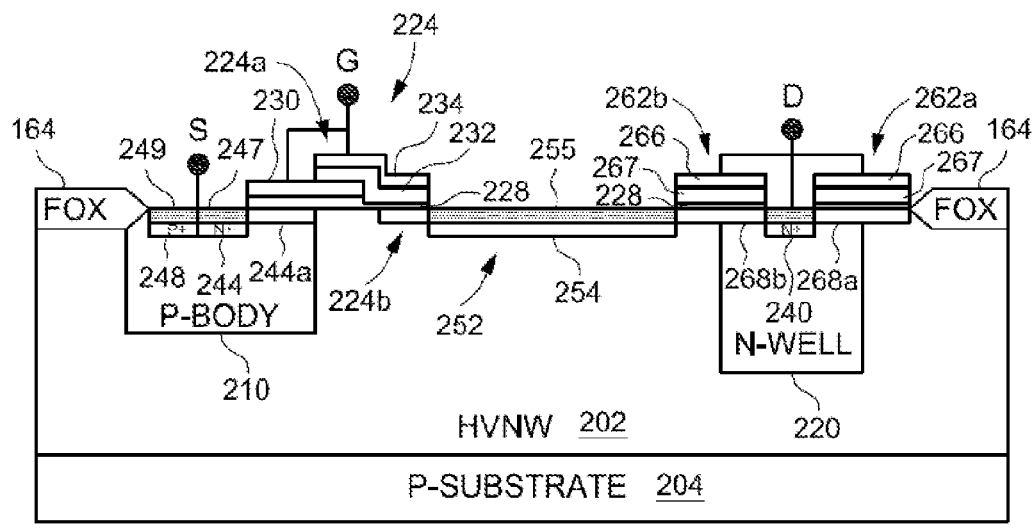
FIG. 2 shows a cross-sectional view of an LDMOS in accordance with an embodiment of the present disclosure.

FIG. 2 shows a cross-sectional diagram schematically illustrating an LDMOS device in accordance with some embodiments of the present disclosure. The LDMOS shown in FIG. 2 includes a high-voltage N-well (HVNW) region 202 on a P-type substrate 204. A P-type body 210 and a N-type well 220 are formed in the HVNW region 202. For the purposes of describing this and other embodiments, it is assumed that the substrate is a P-type substrate, and that certain wells are formed of N- and P-type well regions. However, it will be appreciated by those skilled in that art that the dopant types of the various regions can be changed so as to produce P-type devices instead of N-type devices, and vice versa.

The LDMOS shown in FIG. 2 includes a split gate 224, which includes a thicker HTO layer 232 to provide increased breakdown voltage in the region. The split gate 224 includes a first gate oxide layer 228, a first polysilicon layer 230, an HTO layer 232 (second gate oxide layer), and a second polysilicon layer 234. The first and second polysilicon layers 230 and 234 constitute examples of first and second gate electrodes of the split gate 224. An N+ doped region 240 is formed within the N-type well 220 in order to form a drain region, and another N+ doped region 244 is formed in the P-type body 210 in order to form a source region. In addition, with regard to the N+ doped region 244 formed in the P-type body 210, an adjacent, and preferably adjoining, P+ pickup region 248 is provided to reduce resistivity.

A first portion 224a of the split gate 224 can extend over at least a portion of the P-type body 210. The first portion 224a of the split gate 224 can extend to be adjacent or adjoining to the N+ doped region 244 of the source region. For example, a portion of the N+ doped region 244 can extend to be directly below at least some of the first portion 224a of the split gate 224 as indicated by the extended N+ doped region 244a.

The LDMOS shown in FIG. 2 also includes PI (polysilicon/insulator) gate regions 262a and 262b adjacent to, and on opposing sides of, the N+ doped region 240. The PI gate regions 262a and 262b include an upper polysilicon layer 266, an HTO layer 267 and an under layer gate oxide layer.

A second portion 224b of the split gate 224 extends between the first portion 224a and the N+ doped region 240 that forms the drain region. The second portion 224b of the split gate 224 is separated from the N-type well 220 and the N+ doped region 240 by a drift region 252. The drift region 252 includes a double RESURF feature comprising a first (lower) RESURF region 254 of a first conductivity type (e.g., N-type), and a second (upper) RESURF region 255 of a second conductivity type (e.g., P-type). The double RESURF feature of the drift region 252 can allow for a relatively low on-resistance $R_{on}$.

The split gate 224 can be formed using PIP processes in conjunction with the formation of the PI gate regions 262a and 262b. For example, the under layer gate oxide layer can be formed in conjunction with the formation of the first gate oxide layer 228, the HTO layer 232 can be formed in conjunction with the formation of the insulating HTO layers 267, and the upper polysilicon layer 234 can be formed in conjunction with the formation of the upper polysilicon layers 266, for example using photolithography processes. The split gate 224 and PI gate regions 262a and 262b can be formed prior to formation of the RESURF regions 254 and 255. The upper polysilicon layers 234 and 266 can allow for a self-aligned double RESURF feature since the upper polysilicon layers 234 and 266 can serve as a hard mask for defining the implantation areas for the RESURF regions 254 and 255. FIG. 2 also shows the drain of $N^+$ region 240 is connected with the PI gate regions 262a and 262b.

According to some embodiments, the RESURF regions 254 and 255 can advantageously be formed by using the split gate 224 and PI gate regions 262a and 262b as hardmasks in a self-align fashion. The shallow P− doped region can first be formed in the exposed substrate regions 255, 247 and 249. In some embodiments, the shallow $P^-$ doped region can be formed by implanting boron impurities with the energy in the range of tens KeV, and dose in the range of several to tens $E11/cm^2$, for example, preferably with energy of 30 KeV and dose of 8 $E11/cm^2$. Then, the deeper $N^-$ doped region 254 can be formed in the exposed substrate region 252, as well as penetrated through polysilicon layer and into substrate regions 244a, 224b, 268a and 268b, by using the same split gate 224 and PI gate regions 262a and 262b as hardmasks. In some embodiments, the deeper $N^-$ doped region can be formed by implanting phosphorus impurities with energy in the range of tens to hundreds KeV, and dose in the range of several to tens $E11/cm^2$, for example, preferably with energy in the range of 180 KeV and dose of 10 $E11/cm^2$.

Therefore, the first (lower) RESURF region 254 and the second (upper) RESURF region 255 can be formed. In this way, the threshold voltage Vt of the region 244a can be adjusted, and the relatively low on-resistance $R_{on}$ can be achieved in regions 268a and 224b as well.

It will be appreciated that the embodiment shown in FIG. 2 is only one of several embodiments to which the disclosed concepts can be applied. For example, concepts disclosed herein can also apply equally to devices and manufacturing processes involving local oxidation of silicon (LOCOS) processes, shallow trench isolation (STI) processes, deep trench isolation (DTI) processes, silicon on insulator (SOI) technology devices and processes, processes that involve the growth of N and/or P type epitaxial layers (EPI process), and non-EPI processes. While the LDMOS in FIG. 2 is an N-type LDMOS, alternative embodiments can include P-type LDMOS, N-type EDMOS, and P-type EDMOS devices. Also, those skilled in the art will appreciate that the materials can vary, for example the insulator inter-poly layers can comprise oxide or oxide-nitride-oxide (ONO) materials; the gate electrodes can comprise polysilicon, metal, or silicide polysilicon materials. FIGS. 3-9 show examples of some alternative embodiments, but such alternative examples should not be considered to be representative of an exhaustive list of alternatives.

Figure 3:
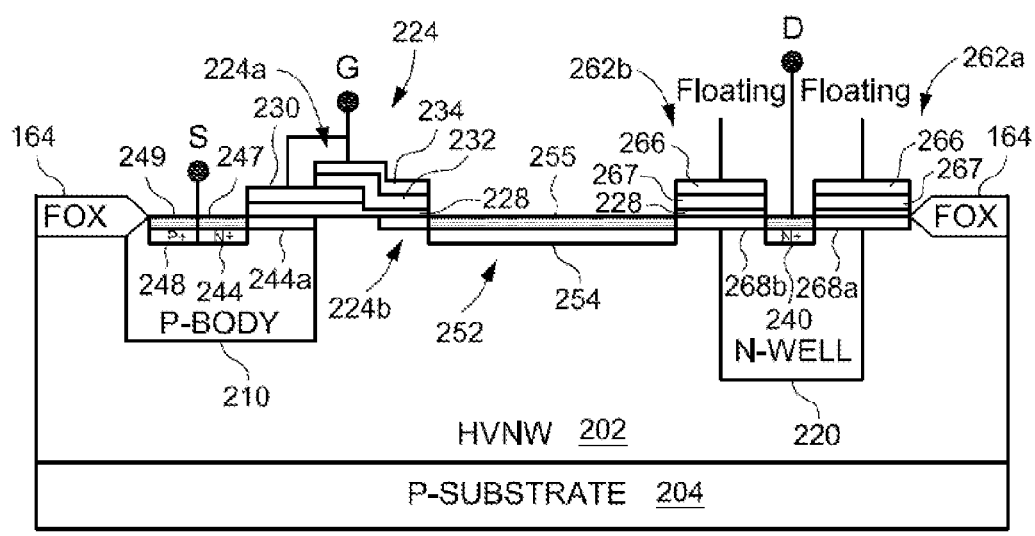
FIG. 3 shows a cross-sectional diagram schematically illustrating an LDMOS device in accordance with some embodiments of the present disclosure where PI gate regions are floating.

FIG. 3 shows a cross-sectional diagram schematically illustrating an LDMOS device in accordance with some embodiments of the present disclosure. The LDMOS shown in FIG. 3 is substantially the same as that shown in FIG. 2, except the embodiment shown in FIG. 3, where the PI gate regions 262a and 262b are not connected with the drain of $N^+$ region 240 are, therefore, floating.

Figure 4:
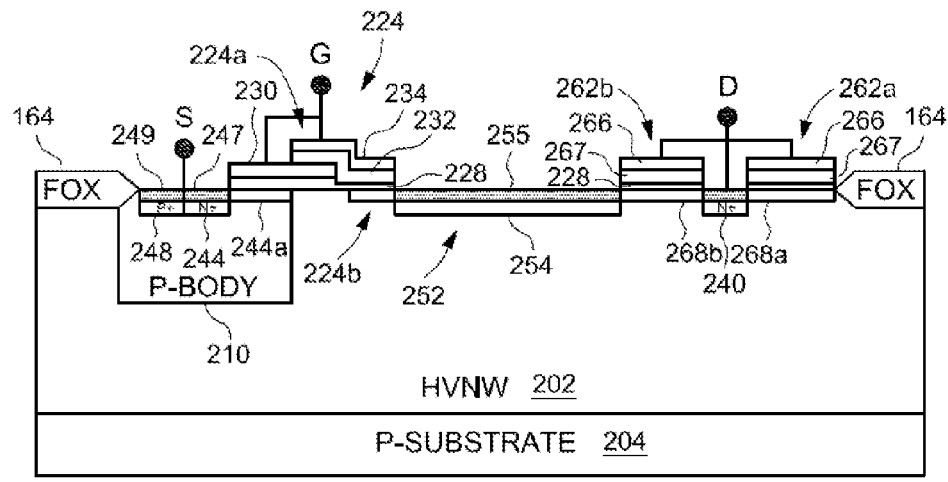
FIG. 4 shows a cross-sectional diagram schematically illustrating an LDMOS device in accordance with some embodiments of the present disclosure that do not include an N-type well that is included in some other embodiments.
Figure 5:
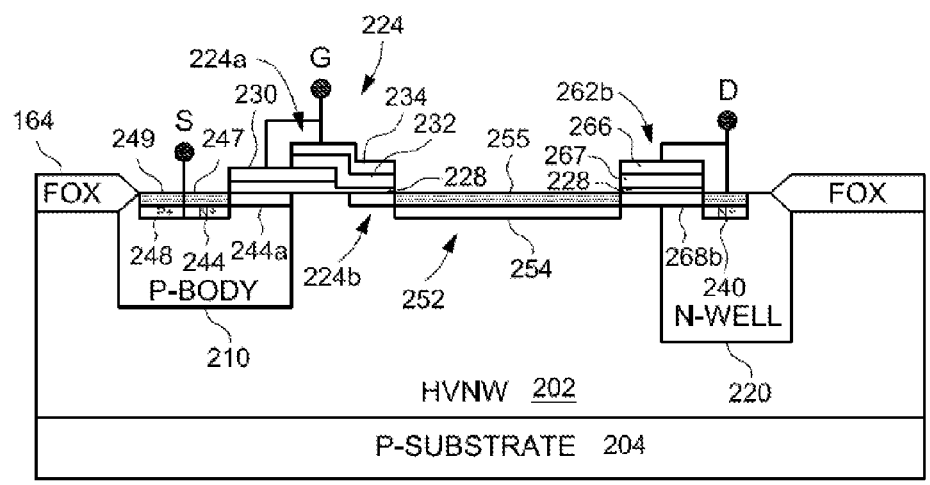
FIG. 5 shows a cross-sectional diagram schematically illustrating an LDMOS device in accordance with some embodiments of the present disclosure having only one PI gate region near the N-type well.

FIGS. 4 and 5 show cross-sectional diagrams schematically illustrating respective LDMOS devices in accordance with two more alternative embodiments of the present disclosure. The LDMOS shown in FIG. 4 is substantially the same as that shown in FIG. 2, except there is no N-type well 220 in the embodiment shown in FIG. 4, while the LDMOS shown in FIG. 5 only has one PI gate region 262b near the N-type well 220.

Figure 6:
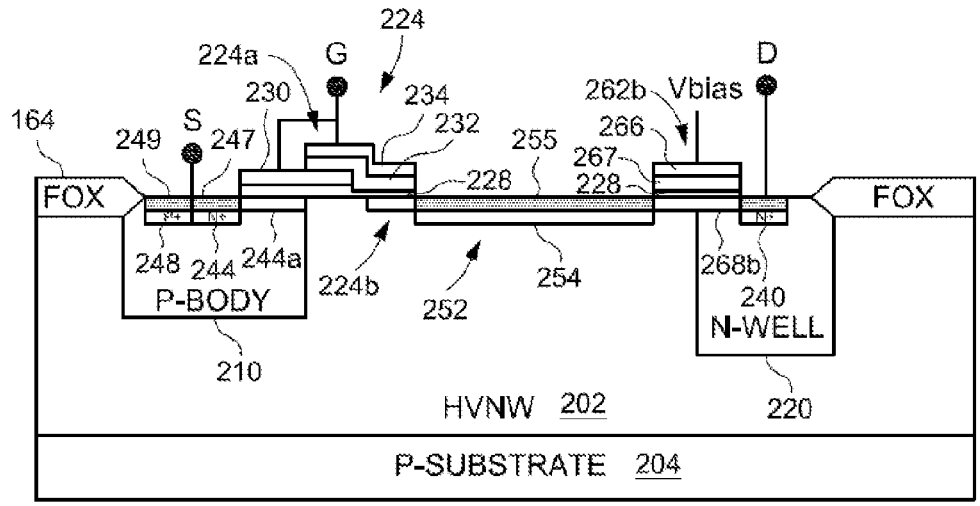
FIG. 6 shows a cross-sectional diagram schematically illustrating an LDMOS device in accordance with some embodiments of the present disclosure where the PI gate region can be biased with voltage Vbias.

FIG. 6 shows a cross-sectional diagram schematically illustrating an LDMOS device in accordance with yet another alternative embodiment of the present disclosure. The LDMOS shown in FIG. 6 is substantially the same as that shown in FIG. 5, except the PI gate region 262b is biased with voltage Vbias.

Figure 7:
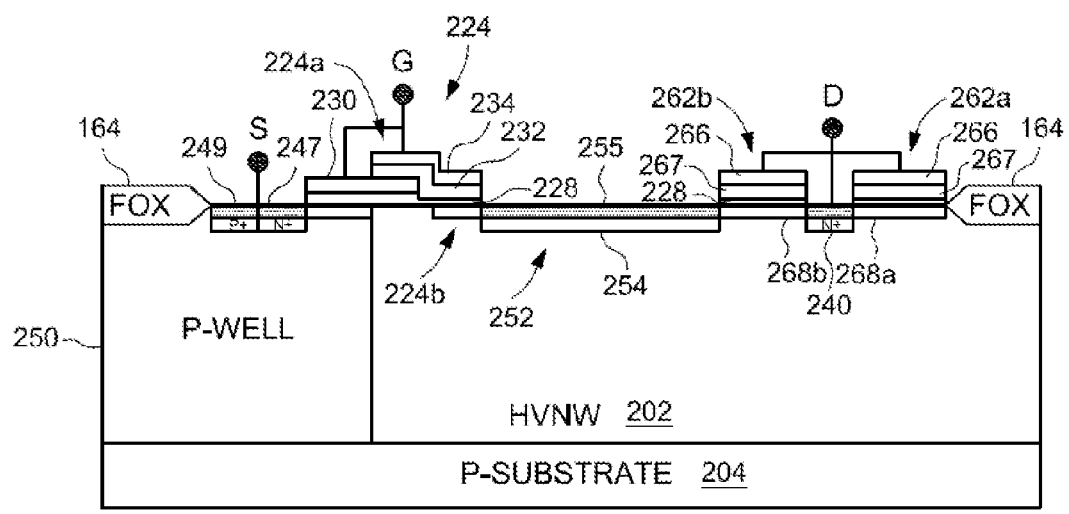
FIG. 7 shows a cross-sectional diagram schematically illustrating an LDMOS device in accordance with some embodiments of the present disclosure where the source region, including an N+ doped region and a P+ pickup region, are formed in a P-type well, and remaining device areas are all formed in a high-voltage N-well (HVNW) region.

FIG. 7 shows a cross-sectional diagram schematically illustrating an LDMOS device in accordance with yet another alternative embodiment of the present disclosure. The LDMOS shown in FIG. 7 is substantially the same as that shown in FIG. 2, except the source region of N+ doped region 244 and P+ pickup region 248 are formed in a P-type well 250 and remaining of the device areas are all formed in a high-voltage N-well (HVNW) region 202 on a P-type substrate 204.

Figure 8:
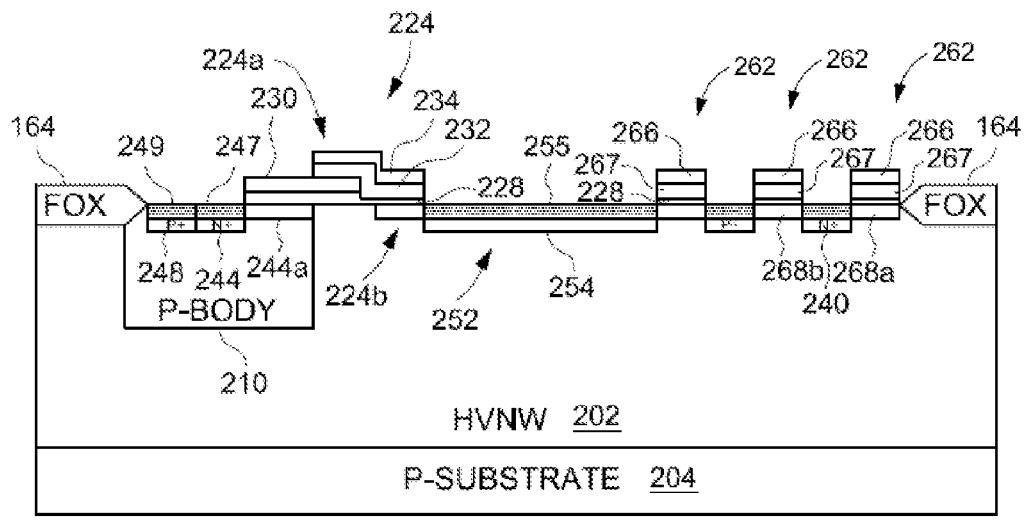
FIG. 8 shows a cross-sectional diagram schematically illustrating an LDMOS device in accordance with some embodiments of the present disclosure that include an additional PI gate region compared to some other disclosed embodiments.

FIG. 8 shows a cross-sectional diagram schematically illustrating an LDMOS device in accordance with some embodiments of the present disclosure. The LDMOS shown in FIG. 8 is substantially the same as that shown in FIG. 2, except the embodiment shown in FIG. 8 includes an additional PI gate region 262. This embodiment illustrates how a multi-P-ring structure can be formed. The additional PI gate region 262 includes the same layers (upper polysilicon layer 266, an HTO layer 267, and a lower gate oxide layer 228) as the PI gate regions 262a and 262b. The upper polysilicon layer 266 can serve as a hard mask layer together with other upper polysilicon layers 234 and 266, resulting in formation of self-aligned double RESURF structure that includes the RESURF regions 254 and 255, as well as the additional RESURF regions 254a and 255a. The bias of the PI gate region 262 can be adjusted according to other embodiments as shown in FIGS. 3-6 as well.

Figure 9:
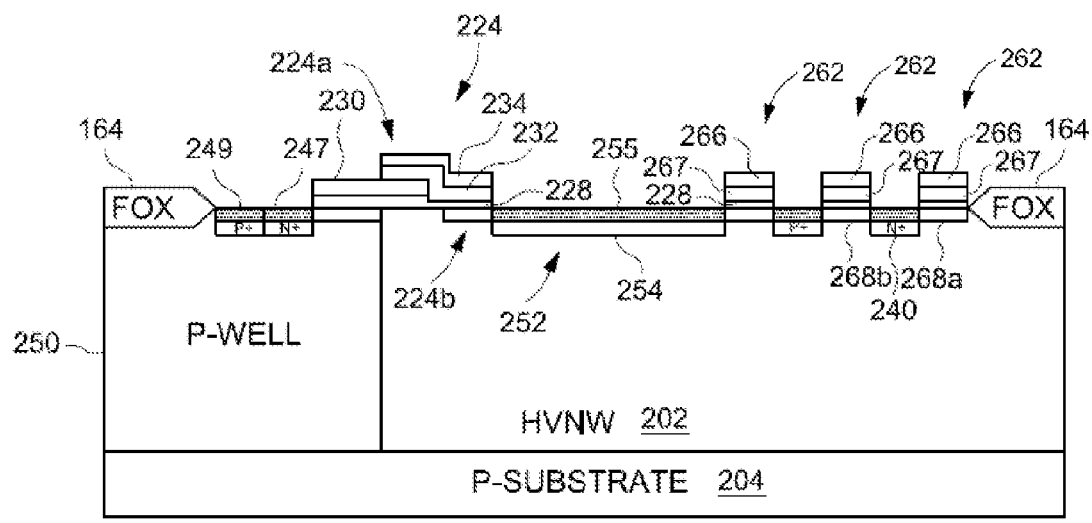
FIG. 9 shows a cross-sectional diagram schematically illustrating an LDMOS device in accordance with some embodiments of the present disclosure that also includes an additional PI gate region, and where the source region, including an N+ doped region and a P+ pickup region, are formed in a P-type well, and remaining device areas are all formed in a high-voltage N-well (HVNW) region.

FIG. 9 shows a cross-sectional diagram schematically illustrating an LDMOS device in accordance with some alternative embodiments of the present disclosure. The LDMOS shown in FIG. 9 is substantially the same as that shown in FIG. 7, except the embodiment shown in FIG. 9 includes an additional PI gate region 262. This embodiment illustrates how a multi-P-ring structure can be formed. The additional PI gate region 262 includes the same layers (upper polysilicon layer 266, an HTO layer 267, and a lower gate oxide layer 228) as the PI gate regions 262a and 262b. The upper polysilicon layer 266 can serve as a hard mask layer together with other upper polysilicon layers 234 and 266, resulting in formation of self-aligned double RESURF structure that includes the RESURF regions 254 and 255, as well as the additional RESURF regions 254a and 255a. The bias of the PI gate region 262 can be adjusted according to other embodiments as shown in FIGS. 3-6 as well.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
   a source region on a substrate;
   a drain region on the substrate;
   a drift region between the source and drain regions;
   a split gate disposed over a portion of the drift region, and between the source and drain regions, the split gate including first and second gate electrodes separated by a gate oxide layer; and
   a gate region disposed between the drift region and the drain region, the gate region including an upper polysilicon layer.

2. The semiconductor device of claim 1, further comprising a pickup region adjacent to the source region, wherein the pickup and source regions are of opposite conductivity types.

3. The semiconductor device of claim 1, wherein the substrate comprises an epitaxial layer.

4. The semiconductor device of claim 1, wherein the gate region comprises multiple gates disposed between the drift region and the drain region.

5. The semiconductor device of claim 1, wherein the split gate comprises:
   a first gate oxide layer over the drift region;
   a first gate electrode layer formed over a first portion of the first gate oxide layer;
   a second gate oxide layer formed over a second portion of the first gate oxide layer and over a portion of the first gate electrode layer; and
   a second gate electrode layer formed over the second gate oxide layer.

6. The semiconductor device of claim 1, wherein the drift region includes a RESURF region.

7. The semiconductor device of claim 6, wherein the RESURF region comprises a first RESURF layer of a first conductivity type.

8. The semiconductor device of claim 7, wherein the RESURF region is a double RESURF region and includes a second RESURF layer of a second conductivity type.

9. The semiconductor device of claim 8, wherein the first conductivity type is n-type, and the second conductivity type is p-type.

10. The semiconductor device of claim 9, wherein the first RESURF layer is disposed below the second RESURF layer.

11. The semiconductor device of claim 9, wherein the first RESURF layer is formed with implant energy in a range of tens to hundreds KeV, and dosage in a range of several to tens $E11/cm^2$, and the second RESURF layer is formed with implant energy in a range of tens KeV, and dosage in a range of several to tens $E11/cm^2$.

12. The semiconductor device of claim 10, wherein the first RESURF layer is formed above a high-voltage N-well (HVNW) region.

13. A semiconductor device, comprising:
   a semiconductor layer of a first conductivity type;
   a drain region of the first conductivity type formed over the semiconductor layer;
   a source region of the first conductivity type formed over the semiconductor layer and spaced apart from the drain region such that a drift region is formed between the drain region and the source region;
   a first gate oxide layer over the drift region;
   a first gate electrode layer formed over a first portion of the first gate oxide layer;
   a second gate oxide layer formed over a second portion of the first gate oxide layer and over a portion of the first gate electrode layer;
   a second gate electrode layer formed over the second gate oxide layer;
   a double RESURF region formed in at least a portion of the drift region, the double RESURF region including a first RESURF layer of the first conductivity type, and a second RESURF layer of the second conductivity type formed over the first RESURF layer; and
   a first gate region disposed between the drift region and the drain region, the first gate region including an upper polysilicon layer.

14. The semiconductor device of claim 13, wherein the first conductivity type is n-type, and the second conductivity type is p-type.

15. The semiconductor device of claim 13, wherein the first RESURF layer is formed with implant energy in a range of tens to hundreds KeV, and dosage in a range of several to tens $E11/cm^2$, and the second RESURF layer is formed with implant energy in a range of tens KeV, and dosage in a range of several to tens $E11/cm^2$.

16. The semiconductor device of claim 13, wherein the semiconductor layer comprises an epitaxial layer.

17. The semiconductor device of claim 13, wherein the gate region comprises multiple gates disposed between the drift region and the drain region.

18. The semiconductor device of claim 13, further comprising:
   a first region of the first conductivity type formed as a first well in the semiconductor layer; and
   a second region of the second conductivity type formed as a second well in the semiconductor layer,
   wherein the drain region is formed in the first region, and the source region is formed in the second region.

19. The semiconductor device of claim 18, further comprising a pickup region of the second conductivity type formed in the second region.

* * * * *